United States Patent [19]

Pappas et al.

[11] Patent Number: 5,846,685
[45] Date of Patent: Dec. 8, 1998

[54] RADIATION SENSITIVE DIAZO SULFO-ACRYLIC ADDUCTS AND METHOD FOR PRODUCING A PRINTING PLATE

[75] Inventors: S. Peter Pappas; Jianbing Huang, both of Wood-Ridge; Ajay Shah, Livingston; Shashikant Saraiya, Parlin, all of N.J.

[73] Assignee: Kodak Polychrome Graphics, LLC, Norwalk, Conn.

[21] Appl. No.: 797,675

[22] Filed: Jan. 31, 1997

[51] Int. Cl.$^6$ .............................. G03F 7/021; G03F 7/095
[52] U.S. Cl. ..................... 430/156; 430/158; 430/162; 430/175; 430/176; 430/278.1; 430/302
[58] Field of Search ..................... 430/156, 157, 430/18, 160, 162, 175, 176, 278.1, 302

[56] References Cited

U.S. PATENT DOCUMENTS

| | | | |
|---|---|---|---|
| 2,714,066 | 7/1955 | Jewett et al. ................................ 95/8 |
| 3,849,392 | 11/1974 | Steppan .................................. 260/141 |
| 4,401,743 | 8/1983 | Incremona ............................... 430/157 |
| 4,408,532 | 10/1983 | Incremona ............................... 101/456 |
| 4,543,315 | 9/1985 | Lorenz et al. ........................... 430/156 |
| 4,595,648 | 6/1986 | Stanton et al. .......................... 430/162 |
| 4,902,601 | 2/1990 | Potts et al. .............................. 430/175 |
| 5,120,799 | 6/1992 | Wade et al. ............................. 525/353 |
| 5,200,291 | 4/1993 | Wanat ..................................... 430/163 |
| 5,278,022 | 1/1994 | Wade et al. ............................. 430/176 |
| 5,300,397 | 4/1994 | Aoshima ................................. 430/176 |
| 5,427,887 | 6/1995 | Konuma et al. ........................ 430/175 |
| 5,527,655 | 6/1996 | Bonham et al. ........................ 430/175 |

FOREIGN PATENT DOCUMENTS

| | | |
|---|---|---|
| 0499447 | 8/1982 | European Pat. Off. . |
| 0130488 | 5/1985 | European Pat. Off. . |
| 0 462 704 A1 | 12/1991 | European Pat. Off. ........ G03F 7/021 |

*Primary Examiner*—John S. Chu
*Attorney, Agent, or Firm*—Ratner & Prestia

[57] ABSTRACT

A radiation sensitive composition containing an adduct of a diazonium resin having pendant diazonium groups, with a sulfonated acrylic copolymer having pendant sulfonate groups. The sulfonated acrylic copolymer contains an acrylic moiety and a sulfonated styryl or acrylic moiety. The copolymer may optionally contain styryl moieties. The composition is useful as a radiation sensitive layer in imaging elements for graphic arts applications and is particularly useful in preparing durable, long-wear, printing plates.

31 Claims, No Drawings

RADIATION SENSITIVE DIAZO SULFO-ACRYLIC ADDUCTS AND METHOD FOR PRODUCING A PRINTING PLATE

BACKGROUND OF THE INVENTION

1. Field of the Invention

This invention relates to a radiation sensitive adduct derived from the combination of a diazo resin, having a plurality of pendant diazonium sites, and an acrylic copolymer having a plurality of sulfonate groups. More particularly, this invention relates to the use of radiation sensitive diazo sulfo-acrylic polymer adducts for the manufacture of printing plates.

2. Description of Related Art

Diazonium resins have long been a preferred material for making presensitized printing plates. Commonly used diazonium resins are those formed by condensation between a few aromatic diazonium salts and formaldehyde or other compounds with activated ethers. These diazo resins alone do not provide durable images for lithographic printing, and therefore, are often used in combination with polymer binders such as polyvinyl acetals.

Although printing plates made from such diazo resins are satisfactory, search for new diazo resins continues with the aim of improving such properties such as press life, ink receptivity, shelf life, photospeed. One strategy is to make high molecular weight diazo resins. U.S. Pat. No. 5,200,291 teaches use of a monomeric diazonium compound ionically attached to a high molecular weight sulfo-functional polyvinyl acetal. U.S. Pat. Nos. 4,595,648 and 4,902,601 teach use of high molecular polymers with covalently bound diazonium groups.

U.S. Pat. No. 4,408,532 discloses use of a diazo adducts made from an oligomeric diazo resin containing a plurality of pendent diazonium groups and a polyester or polyurethane with a plurality of sulfo groups. The sulfo polyester used in diazo adduct preparation was modified in U.S. Pat. No. 4,543,315 to achieve solubility of diazo adduct in low boiling organic solvents. European Patent EP 0462704 A1 teaches use of a diazo adduct made from a branched sulfo-polyester. The main benefits claimed for use of branched sulfo-polyester are photo speed and press durability. However, there are limitations to such diazo adducts such as hydrolytic stability and control of sulfo-group distribution in the sulfo polyester or polyurethane.

While improvements have been made, there continues to be a need for new diazo adducts having improved photo speed, hydrolytic stability, press durability, chemical resistance and other features as required for printing.

SUMMARY OF THE INVENTION

These needs are met by the diazo adducts of this invention which is a radiation sensitive composition consisting essentially of an adduct of a diazonium resin having a plurality of pendant diazonium groups, with a sulfonated acrylic copolymer having a plurality of pendant sulfonate groups, wherein the sulfonated acrylic copolymer comprises at least one acrylic moiety, a sulfonated moiety, and optionally a styryl moiety; and has the structure:

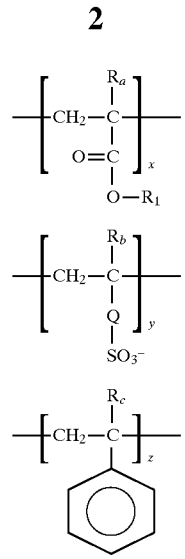

with the proviso that the moieties may be randomly distributed within the copolymer; wherein the combination of x, y, and z taken together is 100 weight %, x is about 20 weight % or more and y is between about 1 weight % and about 20 weight %; wherein the sulfonated acrylic copolymer has a weight average molecular weight between about 5000 and about 100,000; and wherein $R_a$, $R_b$, and $R_c$ are independently selected from H or methyl, $R_1$ is an alkyl, aryl or aralkyl group having 1 to 18 carbon atoms, and Q has a phenylene structure —Ph—W—, or a carbonyl structure —CO—U—$R_4$—, wherein when Q has the phenylene structure, W is a covalent bond or an alkylene group having 1 to 6 carbon atoms, or a group having the structure: —$R_2$—NH—$CO_2$—$R_3$— wherein $R_2$ and $R_3$ are independently selected from alkylene groups having 1 to 6 carbon atoms, and when Q has the carbonyl structure, U is O or NH; $R_4$ is an alkylene group having 1 to 6 carbon atoms, or a group having the structure: —$R_5$—Z—$CO_2$—$R_6$— wherein $R_5$ and $R_6$ are independently selected from alkylene groups having 1 to 6 carbon atoms and Z is an NH group or covalent bond.

A further embodiment of this invention is a radiation sensitive element comprising: a substrate; and a radiation sensitive layer consisting essentially of an adduct of a diazonium resin having a plurality of pendant diazonium groups, with the sulfonated acrylic copolymer described supra having a plurality of pendant sulfonate groups.

A still further embodiment of this invention is a method for producing a printing plate from a radiation sensitive element by (I) imagewise exposing the radiation sensitive element to actinic radiation, wherein the radiation sensitive element comprises: a substrate having a hydrophilic surface; and a developer-soluble, radiation sensitive layer adhered to the hydrophilic surface, the radiation sensitive layer consisting essentially of an adduct of a diazonium resin having a plurality of pendant diazonium groups, with a sulfonated acrylic copolymer described supra having a plurality of pendant sulfonate groups; and (II) applying the developer to the imagewise exposed radiation sensitive layer to remove areas of the radiation sensitive layer which were not exposed to the actinic radiation from the hydrophilic surface of the substrate.

DETAILED DESCRIPTION OF THE INVENTION

The radiation sensitive composition of this invention is an adduct of a diazonium resin having a plurality of pendant diazonium groups and a sulfonated acrylic copolymer having a plurality of pendant sulfonate groups. This radiation sensitive diazo adduct is the reaction product of an oligomeric diazo resin with a sulfonated acrylic copolymer. While the radiation sensitive diazo adduct may be used in a wide variety of graphic arts applications, it is particularly useful in the manufacture of durable, long-wear printing plates, and more particularly lithographic plates which have printing surfaces on both sides of a substrate.

Sulfonated Acrylic Copolymer

The sulfonated acrylic copolymer contains at least one acrylic moiety; a sulfonated moiety, which may be a sulfonated styryl moiety or a sulfonated acrylic moiety or a combination thereof; and optionally a styryl moiety. When the sulfonated acrylic copolymer contains the sulfonated styryl moiety, the copolymer has the structure:

Formula I

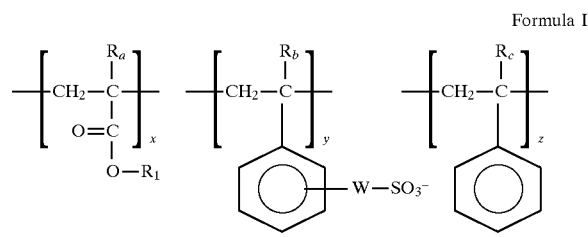

However, when the sulfonated acrylic copolymer contains the sulfonated acrylic moiety, the copolymer has the structure:

Formula II

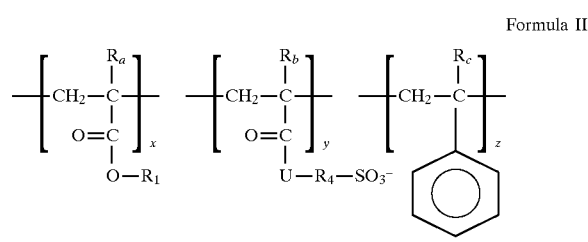

In Formulas I and II, $R_a$, $R_b$, and $R_c$ are independently selected from hydrogen or methyl and $R_1$ is an alkyl, aryl or aralkyl group having 1 to 18 carbon atoms. The acrylic moiety in Formulas I and II may be derived from a single acrylic monomer or from two or more such monomers. Suitable acrylic monomers include methyl acrylate, methyl methacrylate, ethyl acrylate, ethyl methacrylate, propyl acrylate, propyl methacrylate, butyl acrylate, butyl methacrylate, and the like. Preferably the acrylic moiety is a combination of methyl methacrylate and ethyl acrylate. The styryl moiety in Formulas I and II may be derived from styrene or α methyl styrene.

In the sulfonated styryl moiety of Formula I, W is a covalent bond or an alkylene group having 1 to 6 carbon atoms, or a group having the structure: —$R_2$—NH—$CO_2$—$R_3$— wherein $R_2$ and $R_3$ are independently selected from alkylene groups having 1 to 6 carbon atoms. Thus when W represents a covalent bond and $R_b$ is H or methyl, the sulfonated styryl moiety is styryl sulfonate and α methyl styryl sulfonate, respectively. When W represents an alkylene group such as methylene, ethylene, or propylene and $R_b$ is H, the sulfonated styryl moiety is 4-sulfomethyl styrene, 4-sulfoethyl styrene and 4-sulfopropyl styrene, respectively. When W is the group having the structure: —$R_2$—NH—$CO_2$—$R_3$— and $R_2$ is 2,2-propylene; $R_3$ is 1,2-ethylene; and $R_b$ is H, the sulfonated styryl moiety is the reaction product of 1-(1-isocyanato-1-methyl)-ethyl-3-(1-methyl)-ethenyl benzene (hereinafter TMI, a registered trademark of Cytec Industries, Inc., Stanford, Conn.) and isethionic acid ammonium salt.

In the sulfonated acryl moiety of Formula II, U is O or NH; $R_4$ is an alkylene group having 1 to 6 carbon atoms, or a group having the structure: —$R_5$—Z—$CO_2$—$R_6$— wherein $R_5$ and $R_6$ are independently selected from alkylene groups having 1 to 6 carbon atoms and Z is an NH group or covalent bond. Thus the sulfonated acryl moiety may be sulfonated alkylene acrylate, methacrylate, acrylamide, or methacrylamide, wherein the alkylene is methylene, ethylene, propylene, and the like. Preferred sulfonated acryl moieties of this class include 2-acrylamido-2-methylpropane-sulfonic acid, sulfopropyl acrylate, sulfopropyl methacrylate, and 2-sulfoethyl methacrylate.

In Formulas I and II, x, y, and z are intended to designate the weight percent of each moiety in the sulfonated acrylic copolymer and is not intended to designate the order of each moiety within the copolymer. Typically the order of each moiety within the copolymer is determined by the polymerization method and the reactivity of specific monomer components used to make the copolymer. Thus the moieties may be randomly distributed within the copolymer or they may be ordered into blocks depending on the monomers and polymerization method used. For the sulfonated acrylic copolymers of Formulas I and II, x is about 20 weight % or more, y is between about 1 weight % and about 20 weight %, and z is about 50 weight % or less; when the combination of x, y, and z taken together is 100 weight %. Preferably, y is between about 5 weight % and about 15 weight %, and more preferably, between about 5 weight % and about 11 weight %. The sulfonated acrylic polymer of this invention typically has a weight average molecular weight between about 5,000 and about 100,000 and preferably between about 10,000 and about 50,000. Weight average molecular weights may be determined by any conventional means.

The sulfonated acrylic copolymer of Formulas I and II may be prepared by free radical copolymerization of a sulfo-functional unsaturated monomer with an acrylic monomer and optionally other unsaturated monomers, such as styrene, using conventional techniques. In particular a sulfonated monomer such as sodium styrene sulfonate; 2-acrylamido-2-methylpropylsulfonic acid; or sulfopropyl acrylate (or methacrylate) potassium salt may be co-polymerized with an acrylic monomer and the styrene monomer to form the sulfonated acrylic copolymer. Alternatively, the sulfonated acrylic copolymer may be prepared by sulfonating an acrylic copolymer containing aromatic rings, or by reacting a suitable functionality such as carboxy or isocyanate groups with hydroxy- or amino-functional sulfonate compounds. In particular, precursor monomers are first copolymerized and then sulfonated such as when the precursor monomer is styrene which is subsequently sulfonated; or when the precursor monomer is TMI which is subsequently reacted with isethionic acid ammonium salt; or when the precursor molecule is 2-isocyanatoethyl methacrylate which is subsequently reacted with isethionic acid ammonium salt; or when the precursor molecule is 4,4-dimethyl-2-vinyl-oxazolin-5-one and subsequently reacted with isethionic acid ammonium salt, as illustrated in U.S. Pat. No. 5,235,015, incorporated herein by reference; or when the precursor molecule is chloromethyl styrene in which the chloro groups are subsequently converted into sulfonate groups by conventional methods as illustrated by Döscher et al. in Synthesis of Sulfoalkylated Styrene-Divinylbenzene Copolymers, Makromol. Chem., Rapid Commun., 1, 297–302 (1980). Specific methods of preparation are illustrated in the Examples which follow.

Prior to its reaction with a diazonium resin to form the adduct of this invention, the sulfonated acrylic copolymer contains cationic counterions "$M^+$" associated with each sulfonate anion. The cationic counterion is not of particular importance with the exception of solubility characteristics imparted thereby relative to the reaction to form the adduct and subsequent processing. Typical cationic counterions include sodium, potassium, ammonium, multi-alkyl ammonium, and the like.

Diazonium Resin

The diazonium resin used to make the radiation sensitive composition of this invention is a resin which contains a plurality of pendant diazonium groups. Diazonium resins suitable for use in this invention are described in U.S. Pat. Nos. 2,714,066 and 3,849,392, which are incorporated herein by reference. Useful diazonium resins include the condensation product of paraformaldehyde and p-diazodiphenylamine, and the condensation product of 4,4'-bis (methoxy methyl)diphenyl ether with 3-methoxy-4-diazo diphenylamine, and the like. Prior to its reaction with a sulfonated acrylic copolymer to form the adduct of this invention, the diazonium resin contains anionic counterions "$A^-$" associated with each diazonium cation. The anionic counterion is not of particular importance with the exception of solubility characteristics imparted thereby relative to the reaction to form the adduct and subsequent processing. Typical anionic counterions include bisulfate, chloride, zinc chloride double salt, p-toluenesulfonate, mesitylene sulfonate, 4-sulfo-3-methoxy-2-hydroxy benzophenone, and the like.

The radiation sensitive adduct of this invention is prepared by reacting the diazonium resin with the sulfonated acrylic copolymer in a liquid (typically aqueous) medium. During this reaction, the counterions are displaced from the resin and copolymer which in turn become ionically linked through the respective pendant diazonium and sulfonate groups to form the adduct, which is a polyelectrolyte complex. Not all pendant groups are required to react to form the adduct and complete reaction may be precluded by secondary interactions such as steric effects. Consequently residual counter ions typically remain in the adduct formed. The radiation sensitive adduct is soluble or dispersable in a variety of solvents. Solvents useful in dissolving or dispersing the radiation sensitive adduct of this invention include dioxalane; dimethylformamide; 1,2 dichloroethane; methylene chloride; 1:2:2 mixture of methyl lactate, 2-butanone, and toluene; 1:2:2 mixture of 2-methoxy ethanol, 2-butanone, and toluene; and the like. Such solvents are typically used to prepare coating solutions of the solvent soluble adduct. The adduct is sensitive to actinic radiation such as ultraviolet (UV) radiation; infrared (IR) radiation; to high energy radiation and particles (e.g., X-rays, electron beams, etc.); and the like. When the solvent soluble adduct of this invention is exposed to actinic radiation, it is rendered insoluble in the developer. Without being bound by any one theory, it is believed that diazonium groups of the exposed adduct decompose and that ionic linkages between the resin and the copolymer are replaced with permanent covalent crosslinks to form an insoluble network structure. In addition to being sensitive to actinic radiation, adducts of this invention may be insolubilized thermally by suitable heat treatment.

Radiation Sensitive Element

The radiation sensitive composition of this invention may be used in any number of applications such as graphic arts applications; as a photoresist for use in the electronics industry; and the like but is particularly useful in preparing lithographic printing plates. Radiation sensitive elements useful for these applications typically are comprised of a substrate having adhered thereto a radiation sensitive layer consisting essentially of the radiation sensitive adduct of this invention.

Typically, the substrate used in graphic arts applications is a sheet or web material which may be flexible, semi-flexible, or rigid as the application dictates. The substrate may be composed of metal, paper, polymeric film, composite, fabric, or the like. When the radiation sensitive element is to be used to prepare a lithographic printing plate, the substrate typically is a sheet of metal such as aluminum; of paper; or of polymeric film. The surface of each of these substrates may be pre-treated to make it more hydrophilic and enhance its wettability to water. Likewise an intermediate layer may be applied to the substrate as a subbing layer to enhance adhesion of the radiation sensitive layer to the substrate and/or to provide the hydrophilic surface. The intermediate layer may also be a second radiation sensitive layer which is used to enhance adhesion of the radiation sensitive layer to the substrate without affecting the wettability of the substrate surface. In a preferred embodiment of this invention, the substrate is a sheet of aluminum which may have a smooth surface, or a grained surface which is contiguous with the radiation sensitive layer. A grained surface typically is used to enhance both adhesion to the radiation sensitive layer and wettability to aqueous fountain solutions during printing. The radiation sensitive layer of this invention has the unique advantage of retaining adhesion to smooth aluminum surfaces during long printing runs without the need of an intermediate subbing layer.

The radiation sensitive layer consists essentially of the radiation sensitive composition of this invention. As described supra, the radiation sensitive composition consists essentially of an adduct of a diazonium resin having a plurality of pendant diazonium groups, with a specific type of sulfonated acrylic copolymer having a plurality of sulfonate groups. In addition to the adduct, the radiation sensitive layer may contain ancillary adjuvants such as colorants, surface active agents, plasticizers, matting agents or combinations thereof. Colorants, such as pigments, dyes, and the like, typically are added to enhance the visibility of the radiation sensitive layer or to provide a desired color or hue. Matting agents, such as silica, clays, starches and the like, typically are added to alter the surface topography of the radiation sensitive layer. Plasticizers, typically are added to alter the rheological characteristics of the layer such as to increase layer flexibility without cracking. Surface active agents typically are added to enhance application of the coating to the substrate surface and formation of a continuous adduct layer.

The radiation sensitive elements of this invention typically are prepared by applying a coating solution or dispersion of the radiation sensitive composition onto one or more surfaces of the substrate, and then removing the coating solvent under controlled conditions. The coating solution contains the adduct and any ancillary components dissolved or dispersed in a coating solvent. Suitable solvents typically contain a mixture of fast and slow evaporating solvents. Typical coating solvent mixtures include: a 5:1 mixture of dioxalane and dimethylformamide; a 1:2:2 mixture of methyl lactate, 2-butanone, and toluene; a 1:2:2 mixture of 2-methoxy ethanol, 2-butanone, and toluene;, and the like. Any conventional coating method may be used to apply the coating solution to the surface of the substrate and any drying method may be used to remove the coating solution provided that heating conditions are well below the thermal activation of the radiation sensitive adduct.

In an added embodiment of this invention the radiation sensitive element may have an additional radiation sensitive layer adhered to the reverse side of the substrate. Thus the radiation sensitive element comprises a substrate and a radiation sensitive layer consisting essentially of an adduct of a diazonium resin with a sulfonated acrylic copolymer as described supra, wherein the substrate has a rear hydrophilic surface and wherein an added developer-soluble, radiation sensitive layer is adhered to the rear hydrophilic surface; the added developer-soluble, radiation sensitive layer consisting essentially of the adduct of the diazonium resin, with the sulfonated acrylic copolymer. Such double-sided elements are particularly useful to minimize costs in preparing elements which employ expensive substrate materials, such as aluminum for lithographic printing plates.

Printing Plates

A printing plate may be produced from the radiation sensitive element of this invention as described supra. The method of producing the plate from the element comprises imagewise exposing the radiation sensitive element to actinic radiation, wherein the radiation sensitive element comprises a substrate having a hydrophilic surface; and a developer-soluble, radiation sensitive layer adhered to the hydrophilic surface, the radiation sensitive layer consisting essentially of the radiation sensitive composition of this invention, described supra; and applying the developer to the imagewise exposed radiation sensitive layer to remove areas of the radiation sensitive layer which were not exposed to the actinic radiation from the hydrophilic surface of the substrate. The developer may be any organic, aqueous or semiaqueous solvent system, such as the coating solvent described supra. Preferably the developer is an aqueous or semiaqueous solvent system to minimize environmental impact during disposal. Such developer systems include solutions containing 3 to 8 weight % organic solvents such as benzyl alcohol, 3 to 8 weight % surfactants such as sodium n-butyl naphthalene sulfonate, 0.05 to 2 weight % desensitizer such as ammonium sulfite, 3 to 8 weight % natural gum or other water soluble polymers and sufficient water to make 100 weight %. The substrate may have a hydrophilic surface per se or its surface may be rendered hydrophilic by suitable treatment, such as silicate treatment, or by use of a suitable permanent hydrophilic subbing layer. Preferably the substrate is aluminum having a smooth surface or grained surface which is contiguous with the radiation sensitive layer.

The radiation sensitive diazo adduct of this invention will now be illustrated by the following examples but is not intended to be limited thereby.

EXAMPLE 1

In a nitrogen purge, 250 g 1,2-dichloroethane, 40 g styrene, 80 g ethyl acrylate and 80 g methyl methacrylate were heated to 70° C. 2.0 g azo-bis-isobutyronitrile was first dissolved in 50 g 1,2-dichloroethane. Half of the solution was added at a free-flow rate and the remainder was added at a rate of one drop per second. After the addition was completed, the reaction was continued until the theoretical solid content was obtained.

A reaction vessel immersed in an ice bath was first charged with 108 g acetic anhydride and 300 g 1,2-dichloroethane then 75 g sulfuric acid (95%) was added dropwise. The resulting sulfonating agent was then added at 60° C. at a rate of two drops per second. The reaction was continued at 60° C. for 6 hours and then terminated by adding 150 g n-propanol. The sulfonated copolymer product was purified by evaporating the solvent over a 70° C. water bath, redissolving the solid mass in 800 g water/n-propanol (30:70), and tranferring the resulting solution into 5 gallons of deionized (d.i.) water. The product was collected as a precipitate, washed and dried. 170 g of sulfo-acrylic copolymer (A1) was obtained.

A solution containing 4.0 g of the diazo condensation product of 4,4'-bis(methoxy methyl) diphenyl ether with 3-methoxy-4-diazo diphenylamine, the diazo product having mesitylene sulfonate anion; 40 g n-propanol; and 40 g water was dropwise added into a sulfonated copolymer solution containing 16 g A1, 160 g n-propanol, and 180 g water. After the addition, the mixture was stirred for one hour then allowed to stand undisturbed until the precipitated diazo adducts coalesced into a gummy mass. The remaining clear solution was decanted and the gummy mass was redispersed in 600 g water. The dispersed diazo adduct was then collected through filtration, washed with water and air dried. 17 g of diazo adduct (B1) was obtained.

A smooth aluminum sheet made permanently hydrophilic by silicate treatment on both the front and back sides was coated with a solution containing 0.6 g B1, 8 g 2-butanone (hereinafter MEK), 8 g toluene and 4 g 2-methoxy ethanol, 0.02 g Victoria Pure Blue BO, 0.03 g 1% FC-430 fluorocarbon surfactant (available from the 3M Company, St. Paul, Minn., hereinafter FC-430) in MEK. After drying, each side of the resulting plate with a coating weight 0.6 g/m$^2$ on both the front and backside, was imagewise exposed by a UV lamp at a dose of 200 mJ/cm$^2$. The plate was then developed by removing the unexposed image areas with an aqueous developer solution containing benzyl alcohol (4.89 weight %), Pelex NBL (4.89 weight %)(an aqueous solution of sodium n-butyl naphthalene sulfonate, available from the High Point Chemical Corporation), ammonium sulfite (0.1 weight %) and dextrin (5 weight %). The developed plate was tested on a sheet-fed lithographic printing press. More than 40,000 good quality printed impressions were obtained for each side of the plate.

EXAMPLE 2

In a beaker labeled "A", 20 g sodium p-styrene sulfonate was dissolved in 100 g d.i. water. To a separate beaker, labeled "B", was added 20 g styrene, 80 g methyl methacrylate, 80 g ethyl acrylate, 200 g n-propanol, 3.0 g azo-bis-isobutyronitrile and 0.46 g n-dodecylmercaptan. Under nitrogen purge, 6 g of solution from beaker A was added to 38 g of solution from beaker B and the reaction mixture was heated to 80° C. The remaining solutions in beakers A and B were mixed and added to the mixture at a rate of 1.87 ml/min. One and half hours after the addition, an additional 0.50 g azo-bis-isobutyronitrile was added and the reaction mixture was allowed to continue until theoretical conversion to non-volatiles was achieved, corresponding to a 40 weight % copolymer solution.

A solution of 40 g of the diazo condensation product of paraformaldehyde and p-diazo-diphenylamine, having bisulfate anions, in 400 g water, was added drop-wise into a sulfonated copolymer solution obtained by diluting 500 g of the above 40 weight % copolymer solution with 2500 g of water. The precipitated diazo adduct was filtered, washed with water and dried at room temperature.

A smooth aluminum sheet, made permanently hydrophilic by silicate treatment, was coated on both sides by a solution containing 0.6 g of the diazo adduct, 8 g MEK, 8 g toluene and 4 g methyl lactate, 0.02 g Victoria Pure Blue BO, and 0.03 g 1% FC-430 in MEK. After drying, each side of the resulting plate, having a coating weight 0.65 g/m$^2$, was imagewise exposed by a UV lamp at a dose of 200 mJ/cm$^2$. The plate was then developed by removing the unexposed image areas with the developer solution of Example 1. The developed plate was tested on a sheet-fed lithographic printing press. More than 40,000 good quality impressions were obtained from each side of the plate.

EXAMPLE 3

In a nitrogen purge, 277.4 g of propylene glycol methyl ether acetate, 8 g of TMI, 20 g of ethyl acrylate, 72 g of methyl methacrylate and 4 g of t-butyl peroxy benzoate were heated to 120° C. Then a premixed mixture of 24 g of TMI, 60 g of ethyl acrylate, 216 g of methyl methacrylate and 8 g of t-butyl peroxy benzoate were added dropwise over 90 minutes at 120° C. After the addition was completed, 2 g of t-butyl peroxy benzoate was added. The reaction was completed to the theoretical % of non-volatiles (60%) in two and half hours, then cooled to 50° C. 752.0 g of dimethyl formamide (hereinafter DMF) and 23.62 g of isethionic acid ammonium salt were added and the mixture was heated to 70° C. After one hour, 2.88 g of dibutyl tin dilaurate was added and the reaction was carried out to completion as monitored by IR spectroscopy for the disappearance of the isocyanate group having a band at 2275 $cm^{-1}$. 1470 g of this resin solution and 1659 g DMF were added. The resulting solution was cooled to 5° C. and is identified as Resin Solution 1.

In a separate container 85.60 g of the diazo condensation product of paraformaldehyde and p-diazo-diphenylamine, having 4-sulfo-3-methoxy-2-hydroxy benzophenone anion, and 2488.5 g of DMF were added together slowly and cooled to 5° C. This diazo solution was added to Resin Solution 1 at 5° C. and the resulting reaction mixture was stirred for 1.5 hours. The reaction mixture was then precipitated in water/ice and filtered, washed with water and dried at room temperature to yield the dried diazo adduct.

A smooth aluminum sheet, made permanently hydrophilic by silicate treatment, was coated on both sides using 3.77 g of the dried diazo adduct dissolved in DMF/methanol/2-methoxy ethanol (27.4/27.4/38.4 g respectively) to which 0.4 g of Victoria Pure Blue BO dye, 0.024 g of 85% $H_3PO_4$, 0.024 g citric acid were added. Each side of the resulting dried plate was imaged by exposing to UV radiation at 250 $mJ/cm^2$. The plate was developed by removing the unexposed image areas with the developer solution of Example 1. The developed plate was press tested on a OMCSA/Harris H-124 press and more than 40,000 impressions were obtained from each side of the plate.

EXAMPLE 4

In a nitrogen purge, 115.0 g n-propanol, 25.0 g d.i. water, 6.0 g 2-acrylamido-2-methyl-l-propane sulfonic acid, 16.2 g methyl methacrylate, 37.8 g butyl methacrylate and 0.60 g azo-bis-isobutyronitrile were heated at 65° C. for 6 hours, yielding a 30% polymer solution. 106 g of the polymer solution was diluted with 320 g of n-propanol and 360 g of d.i. water. To this solution was added a solution formed by dissolving 8.0 g of the diazo condensation product of Example 1 in a mixture of 80 g of n-propanol and 80 g of d.i. water. The diazo adduct which precipitated was then filtered, washed with water, and dried at room temperature.

A smooth aluminum sheet, made permanently hydrophilic by silicate treatment, was coated on both sides by a solution containing 0.60 g of the diazo adduct, 8.0 g 2-butanone, 8.0 g toluene, 4.0 g 2-methoxyethanol and 0.02 g Victoria Pure Blue BO. Each side of the resulting dried plate, having a coating weight 0.65 $g/m^2$, was imagewise exposed by a UV lamp at a dose of 280 $mJ/cm^2$ then wiped with a cotton swab soaked with the developer solution of Example 1. The imaged plate was tested on a sheet-fed press and 20,000 good quality impressions were obtained from each side of the plate.

EXAMPLE 5

A monomer mixture was made from 100 g water, 10 g sodium styrenesulfonate, 10 g 2-acrylamido-2-methyl-1-propane sulfonic acid, 150 g n-propanol, 20.0 g styrene, 80 g ethyl acrylate, 80 g methyl methacrylate, and 6 g azo-bis-isobutyronitrile. Under a nitrogren purge, 50 g of this mixture was heated to 85° C., and the remainder was added at 2 ml/min. After addition, the reaction continued until theoretical conversion to non-volatiles was achieved, corresponding to a 45 weight % copolymer solution.

A solution of 4 g of the diazo condensate of Example 1 in 40 g d.i. water and 40 g n-propanol was added drop-wise into the sulfonated copolymer solution obtained by diluting 40 g of the above copolymer solution with 160 g of d.i. water and 110 g n-propanol. After mixing for 15 minutes, additional 500 g d.i. water was added. The diazo adduct product separated as a soft gummy mass, which hardened after washing with water. The hardened product was redispersed in water, filtered and dried at room temperature.

A smooth aluminum sheet, made permanently hydrophilic by silicate treatment, was coated on both sides by a solution containing 3.0 g of the diazo adduct, 40 g MEK, 40 g toluene, 20 g 2-methoxy ethanol, 0.15 g Victoria Pure Blue BO, and 0.3 g FC-430 (1%) in MEK. Each side of the resulting plate had a coating weight 0.68 $g/m^2$ after drying. The plate was imagewise exposed by a UV lamp at a dose of 280 $mJ/cm^2$, then developed by removing the unexposed image areas with the developer solution of Example 1. The developed plate was tested on a sheet-fed lithographic printing press. More than 5,000 good quality impressions were obtained from each side of the plate.

EXAMPLE 6

(Comparative)

32 g AQ 1200 (sulfo polyester resin, available from Eastman Chemical Co., Kingsport, Tenn.) was dispersed in a mixture of 320 g of n-propanol and 360 g of d.i. water. The mixture was agitated until a fine dispersion was obtained. To this fine dispersion was added a solution formed by dissolving 8.0 g of the diazo condensation product of Example 1 in a mixture of 80 g of n-propanol and 80 g of d.i. water. The precipitated diazo adduct was filtered, washed with water and dried at room temperature.

A smooth aluminum sheet, made permanently hydrophilic by silicate treatment, was coated on both sides by a 0.6 g solution of the diazo adduct, 30 g 1,2-dichloroethane and 0.02 g Victoria Pure Blue Bo. The resulting plate had a coating weight 0.65 $g/m^2$. The plate was image exposed by a UV lamp at a dose of 280 $mJ/cm^2$ and then wiped with a cotton swab soaked with the developer solution of Example 1. The imaged plate was tested on a sheet-fed press. 40,000 good quality impressions were obtained on the front side, however, less than 1000 impressions were obtained from the backside because of coating adhesion failure.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A radiation sensitive composition comprising an adduct of a diazonium resin, having a plurality of pendant diazonium groups, and a sulfonated acrylic copolymer, having a plurality of pendant sulfonate groups; wherein the sulfonated acrylic copolymer comprises at least one acrylic moiety, a sulfonated moiety, and optionally a styryl moiety; wherein the copolymer has the structure:

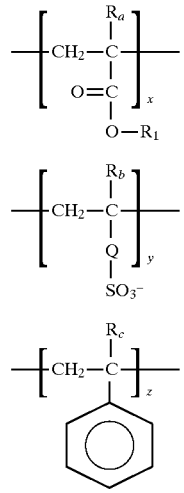

with the proviso that the moieties may be randomly distributed within the copolymer; wherein the combination of x, y, and z taken together is 100 weight %, x is about 20 weight % or more, y is between about 1 weight % and about 20 weight % and z is about 50 weight % or less; wherein the sulfonated acrylic copolymer has a weight average molecular weight between about 5000 and about 100,000; and wherein $R_a$, $R_b$, and $R_c$ are independently selected from H or methyl, $R_1$ is an alkyl, aryl or aralkyl group having 1 to 18 carbon atoms, and Q has a phenylene structure —Ph—W—, or a carbonyl structure —CO—U—$R_4$—, wherein when Q has the phenylene structure, W is a covalent bond or an alkylene group having 1 to 6 carbon atoms, or a group having the structure: —$R_2$—NH—$CO_2$—$R_3$— wherein $R_2$ and $R_3$ are independently selected from alkylene groups having 1 to 6 carbon atoms and when Q has the carbonyl structure, U is O or NH; $R_4$ is an alkylene group having 1 to 6 carbon atoms, or a group having the structure: —$R_5$—Z—$CO_2$—$R_6$— wherein $R_5$ and $R_6$ are independently selected from alkylene groups having 1 to 6 carbon atoms and Z is an NH group or a covalent bond.

2. The radiation sensitive composition of claim 1 wherein the acrylic moiety is a combination of methyl methacrylate and ethyl acrylate.

3. The radiation sensitive composition of claim 1 wherein the sulfonated acrylic copolymer has the structure:

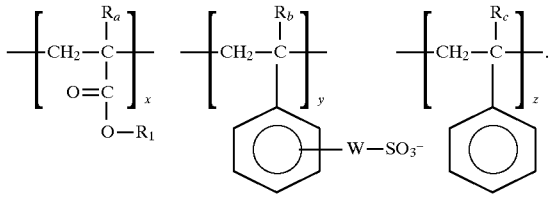

4. The radiation sensitive composition of claim 3 wherein W represents a covalent bond and $R_b$ is H.

5. The radiation sensitive composition of claim 3 wherein W is the group having the structure —$R_2$—NH—$CO_2$—$R_3$—.

6. The radiation sensitive composition of claim 5 wherein $R_2$ is 2,2-propylene; $R_3$ is 1,2-ethylene; and $R_b$ is H.

7. The radiation sensitive composition of claim 1 wherein the sulfonated acrylic copolymer has the structure:

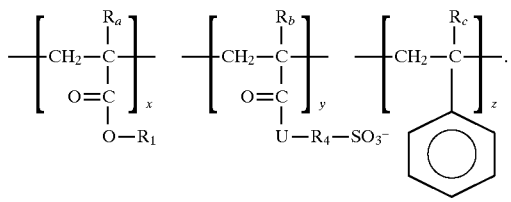

8. The radiation sensitive composition of claim 7 wherein the sulfonated moiety is 2-acrylamido-2-methyl-propanesulfonic acid and the acrylic moiety is a combination of methyl methacrylate and butyl methacrylate.

9. The radiation sensitive composition of claim 1 wherein the sulfonated acrylic copolymer contains the styryl moiety.

10. The radiation sensitive composition of claim 9 wherein z is about 50 weight % or less.

11. The radiation sensitive composition of claim 9 wherein the styryl moiety is styrene.

12. The radiation sensitive composition of claim 1 wherein the diazonium resin is a condensation product of paraformaldehyde and p-diazo-diphenylamine; or a condensation product of 4,4'-bis(methoxymethyl)diphenyl ether and 3-methoxy-4-diazo diphenylamine.

13. The radiation sensitive composition of claim 1 wherein the sulfonated moiety is a combination of a sulfonated styryl moiety and a sulfonated acrylic moiety.

14. A radiation sensitive element comprising a substrate and a radiation sensitive layer consisting essentially of an adduct of a diazonium resin, having a plurality of pendant diazonium groups, and a sulfonated acrylic copolymer having a plurality of pendant sulfonate groups, wherein the sulfonated acrylic copolymer comprises at least one acrylic moiety, a sulfonated moiety, and optionally a styryl moiety; wherein the copolymer has the structure:

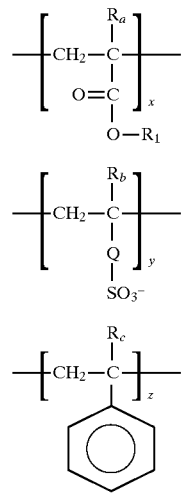

with the proviso that the moieties may be randomly distributed within the copolymer; wherein the combination of x, y, and z taken together is 100 weight %, x is about 20 weight % or more, y is between about 1 weight % and about 20 weight % and z is about 50 weight % or less; wherein the sulfonated acrylic polymer has a weight average molecular weight between about 5000 and about 100,000; and wherein $R_a$, $R_b$, and $R_c$ are independently selected from H or methyl, $R_1$ is an alkyl, aryl or aralkyl group having 1 to 18 carbon atoms and Q has a phenylene structure —Ph—W—, or a carbonyl structure —CO—U—$R_4$—, wherein when Q has the phenylene structure, W is a covalent bond or is an alkylene group having 1 to 6 carbon atoms, or a group having the structure: —$R_2$—NH—$CO_2$—$R_3$— wherein $R_2$ and $R_3$ are independently selected from alkylene groups having 1 to 6 carbon atoms, and when Q has the carbonyl structure, U is O or NH; $R_4$ is an alkylene group having 1 to 6 carbon atoms, or a group having the structure: —$R_5$—Z—$CO_2$—$R_6$— wherein $R_5$ and $R_6$ are independently selected from alkylene groups having 1 to 6 carbon atoms and Z is an NH group or a covalent bond.

15. The radiation sensitive element of claim 14 wherein the sulfonated moiety is a combination of a sulfonated styryl moiety and a sulfonated acrylic moiety.

16. The radiation sensitive element of claim 14 wherein the substrate is a sheet of metal, paper, polymeric film, composite, or fabric.

17. The radiation sensitive element of claim 16 wherein the substrate is aluminum.

18. The radiation sensitive element of claim 17 wherein the aluminum has a grained surface which is contiguous with the radiation sensitive layer.

19. The radiation sensitive element of claim 14 wherein the radiation sensitive layer contains an adjuvant selected from the group of colorants, surface active agents, plasticizers and combinations thereof.

20. The radiation sensitive element of claim 14 further comprising an intermediate layer between the substrate and the radiation sensitive layer.

21. The radiation sensitive element of claim 20 wherein the intermediate layer is a second radiation sensitive layer.

22. The radiation sensitive element of claim 20 wherein the intermediate layer is a subbing layer.

23. The radiation sensitive element of claim 14 wherein the rear surface of the substrate has a hydrophilic surface and wherein a separate added developer-soluble, radiation sensitive layer is adhered to the rear hydrophilic surface.

24. The radiation sensitive element of claim 23 wherein the developer-soluble, radiation sensitive layer adhered to the front and rear hydrophilic surfaces are identical.

25. A method for producing a printing plate from a radiation sensitive element comprising (I) imagewise exposing the radiation sensitive element to actinic radiation, wherein the radiation sensitive element comprises a substrate having a front hydrophilic surface; and a developer-soluble, radiation sensitive layer adhered to the front hydrophilic surface, the radiation sensitive layer consisting essentially of an adduct of a diazonium resin having a plurality of pendant diazonium groups, with a sulfonated acrylic copolymer having a plurality of pendant sulfonate groups, wherein the sulfonated acrylic copolymer comprises at least one acrylic moiety, a sulfonated moiety, and optionally a styryl moiety; wherein the copolymer has the structure:

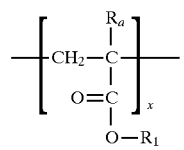

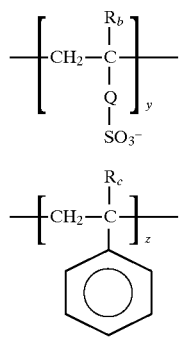

with the proviso that the moieties may be randomly distributed within the copolymer; wherein the combination of x, y, and z taken together is 100 weight %, x is about 20 weight % or more, y is between about 1 weight % and about 20 weight % and z is about 50 weight % or less; wherein the sulfonated acrylic copolymer has a weight average molecular weight between about 5000 and about 100,000; and wherein $R_a$, $R_b$, and $R_c$ are independently selected from H or methyl, $R_1$ is an alkyl, aryl or aralkyl group having 1 to 18 carbon atoms, and Q has a phenylene structure —Ph—W—, or a carbonyl structure —CO—U—$R_4$—, wherein when Q has the phenylene structure, W is a covalent bond or an alkylene group having 1 to 6 carbon atoms, or a group having the structure: —$R_2$—NH—$CO_2$—$R_3$— wherein $R_2$ and $R_3$ are independently selected from alkylene groups having 1 to 6 carbon atoms, and when Q has the carbonyl structure, U is O or NH; $R_4$ is an alkylene group having 1 to 6 carbon atoms, or a group having the structure: —$R_5$—Z—$CO_2$—$R_6$— wherein $R_5$ and $R_6$ are independently selected from alkylene groups having 1 to 6 carbon atoms and Z is an NH group or a covalent bond; whereby areas of the radiation sensitive layer which are exposed are rendered insoluble in a developer solution; and (II) applying the developer to the imagewise exposed radiation sensitive layer.

26. The method of claim 25 wherein the sulfonated moiety is a combination of a sulfonated styryl moiety and a sulfonated acrylic moiety.

27. The method of claim 25 wherein the substrate is aluminum.

28. The method of claim 27 wherein the aluminum has a grained surface which is contiguous with the radiation sensitive layer.

29. The method of claim 25 wherein the substrate has a rear hydrophilic surface and wherein an added developer-soluble, radiation sensitive layer is adhered to the rear hydrophilic surface; the added developer-soluble, radiation sensitive layer consisting essentially of the adduct of the diazonium resin, with the sulfonated acrylic copolymer; and wherein both layers are imagewise exposed, and developed.

30. The method of claim 28 wherein the substrate is aluminum.

31. The method of claim 30 wherein the aluminum has a grained surface which is contiguous with the radiation sensitive layer.

* * * * *